(12) United States Patent
Gallagher et al.

(10) Patent No.: US 7,723,850 B2
(45) Date of Patent: May 25, 2010

(54) ELECTRONIC DEVICES HAVING AIR GAPS

(75) Inventors: Michael K. Gallagher, Hopkinton, MA (US); Dana A. Gronbeck, Holliston, MA (US); Timothy G. Adams, Sudbury, MA (US); Jeffrey M. Calvert, Acton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/891,857

(22) Filed: Aug. 13, 2007

(65) Prior Publication Data

US 2008/0038518 A1    Feb. 14, 2008

Related U.S. Application Data

(62) Division of application No. 10/661,051, filed on Sep. 13, 2003, now Pat. No. 7,256,127.

(60) Provisional application No. 60/414,857, filed on Sep. 13, 2002, provisional application No. 60/442,162, filed on Jan. 23, 2003.

(51) Int. Cl.
| | |
|---|---|
| *H01L 23/48* | (2006.01) |
| *H01L 23/52* | (2006.01) |
| *H01L 29/40* | (2006.01) |
| *H01L 27/10* | (2006.01) |
| *H01L 29/73* | (2006.01) |
| *H01L 29/74* | (2006.01) |
| *H01L 29/80* | (2006.01) |
| *H01L 31/112* | (2006.01) |

(52) U.S. Cl. ............... 257/758; 257/207; 257/208; 257/211; 257/276; 257/522; 257/759; 257/760; 257/E27.001; 257/E29.001

(58) Field of Classification Search ......... 257/207–208, 257/211, 522, 758–760, 276, E27.001, E29.001
See application file for complete search history.

(56) References Cited

U.S. PATENT DOCUMENTS

| | | | |
|---|---|---|---|
| 4,265,794 A * | 5/1981 | Pett et al. .................... 524/277 |
| 4,667,004 A | 5/1987 | Wong ........................ 526/284 |
| 4,987,101 A | 1/1991 | Kaanta et al. .............. 438/619 |
| 5,103,288 A | 4/1992 | Sakamoto et al. .......... 257/758 |

(Continued)

FOREIGN PATENT DOCUMENTS

JP    354012500    1/1979

(Continued)

OTHER PUBLICATIONS

European Search Report of corresponding European Application No. 03 25 5695 mailed Jan. 9, 2008.

(Continued)

*Primary Examiner*—Ida M Soward
(74) *Attorney, Agent, or Firm*—Jonathan D. Baskin (57) ABSTRACT

A method of forming air gaps within a solid structure is provided. In this method, a sacrificial material is covered by an overlayer. The sacrificial material is then removed through the overlayer to leave an air gap. Such air gaps are particularly useful as insulation between metal lines in an electronic device such as an electrical interconnect structure. Structures containing air gaps are also provided.

4 Claims, 4 Drawing Sheets

U.S. PATENT DOCUMENTS

| | | | |
|---|---|---|---|
| 5,266,126 A | 11/1993 | Deguchi | 136/256 |
| 5,324,683 A | 6/1994 | Fitch et al. | 438/422 |
| 5,461,003 A | 10/1995 | Havemann et al. | 438/666 |
| 5,567,982 A * | 10/1996 | Bartelink | 257/664 |
| 5,668,398 A * | 9/1997 | Havemann et al. | 257/522 |
| 5,909,637 A * | 6/1999 | Charneski et al. | 438/687 |
| 5,923,074 A | 7/1999 | Jeng | 257/522 |
| 5,936,295 A | 8/1999 | Havemann et al. | 257/522 |
| 5,994,776 A * | 11/1999 | Fang et al. | 257/758 |
| 6,071,805 A * | 6/2000 | Liu | 438/619 |
| 6,078,088 A * | 6/2000 | Buynoski | 257/410 |
| 6,124,198 A * | 9/2000 | Moslehi | 438/622 |
| 6,141,072 A * | 10/2000 | Drabik et al. | 349/122 |
| 6,150,010 A * | 11/2000 | Eissa | 428/201 |
| 6,165,890 A | 12/2000 | Kohl et al. | 438/619 |
| 6,211,561 B1 * | 4/2001 | Zhao | 257/522 |
| 6,231,743 B1 | 5/2001 | Etherington | 205/83 |
| 6,261,942 B1 | 7/2001 | Zhou et al. | 438/619 |
| 6,284,675 B1 * | 9/2001 | Jin et al. | 438/778 |
| 6,287,979 B1 * | 9/2001 | Zhou et al. | 438/723 |
| 6,316,347 B1 | 11/2001 | Chang et al. | 438/619 |
| 6,333,255 B1 * | 12/2001 | Sekiguchi | 438/622 |
| 6,342,722 B1 | 1/2002 | Armacost et al. | 257/522 |
| 6,368,939 B1 * | 4/2002 | Sasaki | 438/421 |
| 6,380,106 B1 | 4/2002 | Lim et al. | 438/778 |
| 6,420,441 B1 | 7/2002 | Allen et al. | 521/77 |
| 6,423,465 B1 * | 7/2002 | Hawker et al. | 430/203 |
| 6,423,629 B1 | 7/2002 | Ahn et al. | 438/622 |
| 6,469,761 B1 * | 10/2002 | Drabik et al. | 349/122 |
| 6,492,732 B2 | 12/2002 | Lee et al. | 257/758 |
| 6,509,386 B1 | 1/2003 | Kohl | 527/77 |
| 6,528,426 B1 | 3/2003 | Olsen et al. | 438/689 |
| 6,562,732 B2 | 5/2003 | Besling et al. | 438/780 |
| 6,566,243 B2 | 5/2003 | Gaynor | 438/622 |
| 6,589,865 B2 | 7/2003 | Dixit et al. | 438/637 |
| 6,610,593 B2 | 8/2003 | Kohl et al. | 438/623 |
| 6,737,725 B2 | 5/2004 | Grill et al. | 257/522 |
| 6,815,329 B2 | 11/2004 | Babich et al. | 438/619 |
| 6,835,616 B1 * | 12/2004 | Ben-Tzur et al. | 438/244 |
| 6,946,382 B2 * | 9/2005 | Townsend et al. | 438/619 |
| 7,119,418 B2 * | 10/2006 | Xu et al. | 257/639 |
| 2001/0028921 A1 * | 10/2001 | Shaw et al. | 427/248.1 |
| 2004/0061229 A1 * | 4/2004 | Moslehi | 257/758 |
| 2004/0126921 A1 | 7/2004 | Volant et al. | 438/52 |
| 2004/0132276 A1 | 7/2004 | Kloster et al. | 438/619 |
| 2005/0089803 A1 * | 4/2005 | Bouaidat et al. | 430/312 |
| 2005/0164127 A1 * | 7/2005 | Reid et al. | 430/311 |

FOREIGN PATENT DOCUMENTS

| | | |
|---|---|---|
| JP | 64-007540 | 1/1989 |
| JP | 11-095432 | 4/1999 |
| JP | 2002-124513 | 4/2002 |
| TW | 452921 B | 9/2001 |
| WO | WO 98/32169 | 7/1998 |
| WO | WO 99/14404 | 3/1999 |

OTHER PUBLICATIONS

"Reduced Capacitance Interconnect System Using Decomposition of Air Gap Filler Material", IBM Technical Disclosure Bulletin, IBM Corp. New York, U.S., vol. 38, No. 9, Sep. 1955, pp. 137-140.

George Odian, "Principles of Polymerization", 1981, Second Edition, p. 18.

Kohl et al., "Air Gaps for Electrical Interconnections", Electrochemical and Solid State Letters, 1 (1) pp. 49-51 (1998).

George Odian, "Step Polymerization"; Principles of Polymerization, Third Edition, 1991, pp. 108-109.

\* cited by examiner

ELECTRONIC DEVICES HAVING AIR GAPS

This application is a divisional application of application Ser. No. 10/661,051, filed Sep. 13, 2003, now U.S. Pat. No. 7,256,127, which application claims the benefit of Provisional Application No. 60/414,857, filed on Sep. 13, 2002, and Provisional Application Ser. No. 60/442,162, filed on Jan. 23, 2003.

BACKGROUND OF THE INVENTION

This invention relates generally to the field of electronic device manufacture. In particular, this invention relates to the manufacture of electronic devices using air gaps to reduce capacitive coupling between conductors in such devices.

Advances in integrated circuit technology have reduced the spacing between the metal lines on any given plane of an integrated circuit. Such spacing is now in the sub-micron range. Reducing the spacing between conductive members in the integrated circuit results in an increase in capacitive coupling between nearby conductive traces. This increase in capacitive coupling causes problems, such as greater cross-talk and higher capacitive losses.

Conventional dielectric materials have a dielectric constant in the range of 3.5 to 4.2, e.g. silicon dioxide has a dielectric constant of 4.2. Low dielectric constant ("low-k") materials are being developed as a replacement for conventional dielectric materials used between conductors on a given layer and between layers. These low-k materials reduce capacitive coupling between the conductors as compared to conventional dielectric materials. An example of such a low-k material is porous silicon dioxide, i.e. a silicon dioxide film having pores or voids within the film. The pores or voids may contain a vacuum or be filled with air or other gas. Typically, the low-k materials have dielectric constants in the 1.8 to 3.0 range. However, low-k materials have not been used in all applications as they can possess severe processing, cost and materials problems.

The lowest possible, or ideal, dielectric constant is 1.0, which is the dielectric constant of a vacuum. Air is almost equivalent with a dielectric constant of 1.001. Accordingly, attempts have been made to fabricate semiconductor devices with air gaps between metal leads to reduce the capacitive coupling between the electrically conducting members. The air gap forming techniques that have been developed have varying degrees of complexity but typically employ a material disposed between metal lines that is subsequently removed to provide an air gap. However, these techniques are not without problems.

U.S. Pat. No. 5,461,003 (Havemann et al.) discloses a method of forming air gaps in a multilevel interconnect structure. This method disposes a removable solid layer, such as a photoresist, between metal lines and then disposes a porous layer over the removable solid layer. The removable solid layer is subsequently decomposed with the decomposition products passing through the porous layer. The removable solid layer is typically decomposed in an oxygen-containing atmosphere, and in particular an oxygen plasma. This method may be detrimental to other layers in the structure, particularly organic low-k dielectric materials used elsewhere in the structure. Further, photoresists contain a variety of components which make control of the decomposition temperature difficult. Thus, photoresists may take a long time to be removed entirely and/or require harsh conditions to ensure complete removal of all the photoresist components. This patent fails to mention any residue levels following removal of the solid material.

U.S. Pat. No. 6,165,890 (Kohl et al.) discloses a method of forming air gaps in electrical interconnects using polycycloolefin polymers, such as polynorbornene polymers, as the air gap forming material. However, such polycycloolefin polymers are expensive to make and may require relatively high decomposition temperatures, e.g. 380 to 450° C. Such temperatures may be detrimental to other materials used in the fabrication of electrical interconnects. In addition, polycycloolefin polymers are typically prepared using metal catalysts which may contaminate the polymer and result in metal ion contamination in the air gap formed from these polymers.

There is a continuing need for air gap forming materials that can be easily applied to a structure, that can be removed leaving little to no residue, and that can be removed under mild conditions that are compatible with a broad range of materials.

SUMMARY OF THE INVENTION

The present invention provides a method of forming an air gap in a device including the steps of; a) disposing a sacrificial material layer on a device substrate; b) disposing a porous overlayer material on the sacrificial material layer; and then c) removing the sacrificial material layer to form an air gap; wherein the sacrificial material layer includes a cross-linked polymer.

The present invention also provides a method of manufacturing an electronic or optoelectronic device including the steps of; a) disposing a sacrificial material layer on an electronic or optoelectronic device substrate; b) disposing a porous overlayer material on the sacrificial material layer; and then c) removing the sacrificial material layer to form an air gap; wherein the sacrificial material layer includes a cross-linked polymer.

The present invention further provides a method of manufacturing an electronic or optoelectronic device including the steps of; a) disposing a composition including a sacrificial material composition on an electronic or optoelectronic device substrate; b) curing the sacrificial material composition to form a sacrificial material layer; c) disposing a porous overlayer material on the sacrificial material layer; and then d) removing the sacrificial material layer to form an air gap.

Additionally, the present invention provides an electronic device structure including a first layer including metal lines and a sacrificial material layer and a second layer disposed over the metal lines and the sacrificial material; wherein the sacrificial material layer includes a cross-linked polymer.

DETAILED DESCRIPTION OF THE INVENTION

As used throughout this specification, the following abbreviations shall have the following meanings, unless the context clearly indicates otherwise; ° C.=degrees centigrade; μm=micron=micrometer; UV=ultraviolet; rpm=revolutions per minute; nm=nanometer; Å=Angstroms; g=gram; % wt=% by weight; L=liter; mL=milliliter; min.=minutes;

HEMA=hydroxyethyl methacrylate; HPMA=hydroxypropyl methacrylate; ALMA=allyl methacrylate; PETA=pentaerythritol triacrylate; PETMA=pentaerythritol trimethacrylate; TMPTA=trimethylolpropane triacrylate; TMPTMA=trimethylolpropane trimethacrylate; and MMA=methyl methacrylate The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The term "polymer" includes both homopolymers and copolymers. The terms "oligomer" and "oligomeric" refer to dimers, trimers, tetramers and the like. "Monomer" refers to any ethylenically or acetylenically unsaturated compound capable of being polymerized. Such monomers may contain one or more double or triple bonds. "Cross-linker" and "cross-linking agent" are used interchangeably throughout this specification and refer to a compound having two or more groups capable of being polymerized. As used herein, the terms "cure" and "curing" refer to polymerization, condensation or any other reaction where the molecular weight of a compound is increased. The step of solvent removal alone is not considered "curing" as used in this specification. However, a step involving both solvent removal and, e.g., polymerization is within the term "curing" as used herein. "Halo" refers to fluoro, chloro, bromo and iodo. Likewise, "halogenated" refers to fluorinated, chlorinated, brominated and iodinated.

Unless otherwise noted, all amounts are percent by weight and all ratios are by weight. All numerical ranges are inclusive and combinable in any order, except where it is clear that such numerical ranges are constrained to add up to 100%.

The present invention relates to a method for forming an air gap in a solid structure, sacrificial materials useful for forming air gaps, and a method of manufacturing electronic or optoelectronic devices containing air gaps. Structures containing the sacrificial materials are also contemplated by this invention. Suitable electronic devices include, but are not limited to, interconnect structures, semiconductors, semiconductor packaging, printed wiring boards, and the like. As used herein, the term "electronic devices" includes micro-electrical mechanical devices ("MEMS") and nano-electrical mechanical devices ("NEMS"). Suitable MEMS include, without limitation, gears, moveable planes, oscillators, springs, and the like. The term "optoelectronic devices" as used herein is also intended to include photonic devices. Suitable optoelectronic devices include, without limitation, waveguides, splitters, array waveguides, couplers, spectral filters, polarizers, isolators, wavelength division multiplexing structures, optical switches, diffraction gratings, interconnects, attenuators, amplifiers, and the like.

In one embodiment, the present invention provides a method of forming an air gap in a device including the steps of; a) disposing a sacrificial material layer on a device substrate; b) disposing an overlayer material on the sacrificial material layer; and then c) removing the sacrificial material layer to form an air gap; wherein the sacrificial material includes a cross-linked polymer. An "air gap" is formed in the area where the sacrificial material was prior to its removal. Devices that can be formed according this method include, without limitation, electronic and optoelectronic devices.

The sacrificial material may be any suitable cross-linked polymer. Exemplary cross-linked polymers include, without limitation, polymers containing as polymerized units one or more monomers of (meth)acrylic acid, (meth)acrylamides, alkyl(meth)acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, and the like, and one or more cross-linking agents.

Particularly suitable polymers are those including as polymerized units one or more (meth)acrylic acid monomers, (meth)acrylate monomers, (meth)acrylamide monomers or any combination of these monomers. Such polymers may include one or more other monomers as polymerized units, such as those described above. (Meth)acrylate monomers include alkyl(meth)acrylates, alkenyl(meth)acrylates, and aromatic (meth)acrylates. (Meth)acrylamide monomers include (meth)acrylamide and alkyl(meth)acrylamides. Typically, the alkyl(meth)acrylates useful in the present invention are $(C_1-C_{24})$alkyl(meth)acrylates. Suitable alkyl(meth)acrylates include, but are not limited to, "low cut" alkyl(meth) acrylates, "mid cut" alkyl(meth)acrylates and "high cut" alkyl(meth)acrylates.

"Low cut" alkyl(meth)acrylates are typically those where the alkyl group contains from 1 to 6 carbon atoms. Suitable low cut alkyl(meth)acrylates include, but are not limited to, methyl methacrylate, methyl acrylate, ethyl acrylate, propyl methacrylate, butyl methacrylate, butyl acrylate, isobutyl methacrylate, hexyl methacrylate, cyclohexyl methacrylate, cyclohexyl acrylate and mixtures thereof.

"Mid cut" alkyl(meth)acrylates are typically those where the alkyl group contains from 7 to 15 carbon atoms. Suitable mid cut alkyl(meth)acrylates include, but are not limited to, 2-ethylhexyl acrylate, 2-ethylhexyl methacrylate, octyl methacrylate, decyl methacrylate, isodecyl methacrylate (based on branched $(C_{10})$alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof.

"High cut" alkyl(meth)acrylates are typically those where the alkyl group contains from 16 to 24 carbon atoms. Suitable high cut alkyl(meth)acrylates include, but are not limited to, hexadecyl methacrylate, heptadecyl methacrylate, octadecyl methacrylate, nonadecyl methacrylate, cosyl methacrylate, eicosyl methacrylate and mixtures thereof.

The mid-cut and high-cut alkyl(meth)acrylate monomers described above are generally commercially available or may be prepared by standard esterification procedures using technical grades of long chain aliphatic alcohols. These commercially available alcohols are mixtures of alcohols of varying chain lengths containing between 10 and 15 or 16 and 20 carbon atoms in the alkyl group.

Alkyl(meth)acrylate and alkenyl(meth)acrylate as used herein are intended to include not only the individual alkyl or alkenyl(meth)acrylate product named, but also to include mixtures of the alkyl or alkenyl(meth)acrylates with a predominant amount of the particular alkyl or alkenyl(meth) acrylate named. Accordingly, the alkyl(meth)acrylate monomers useful in the present invention may be a single monomer or a mixture having different numbers of carbon atoms in the alkyl portion. Also, the (meth)acrylamide and alkyl(meth) acrylate monomers useful in the present invention may optionally be substituted, such as with hydroxy, dialkylamino or dialkylaminoalkyl groups.

Suitable hydroxyalkyl(meth)acrylate monomers include, but are not limited to, 2-hydroxyethyl methacrylate, 2-hydroxyethyl acrylate, 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to, dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-diethylaminoethyl methacrylamide, N,N-diethylaminopropyl methacrylamide, N,N-diethylaminobutyl methacrylamide, N-(1,1-dimethyl-3-oxobutyl)acrylamide, N-(1,3-diphenyl-1-ethyl-3-oxobutyl)acrylamide, N-(1-methyl-1-phenyl-3-oxobutyl)methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

The vinyl aromatic monomers useful as unsaturated monomers in the present invention include, but are not limited to, styrene, hydroxystyrene, α-methylstyrene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$-$C_{10}$) alkoxy, halo($C_1$-$C_{10}$)alkyl, carb($C_1$-$C_{10}$)alkoxy, carboxy, amino, ($C_1$-$C_{10}$)alkylamino derivatives and the like.

The nitrogen-containing compounds and their thio-analogs useful as unsaturated monomers in the present invention include, but are not limited to; vinylpyridines such as 2-vinylpyridine or 4-vinylpyridine; ($C_1$-$C_8$)alkyl substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers in the present invention include, but are not limited to, vinyl acetate, vinyl formamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate and vinyl ethers.

In addition, the present polymers may include as polymerized units one or more poly(alkylene oxide) monomers. As used herein, the term "poly(alkylene oxide) monomers" includes monomers having the formula X—(O—R)$_n$—Y where X=hydrogen, R=($C_1$-$C_4$)alkyl, Y=hydroxy or ($C_1$-$C_4$) alkoxy and $n \geq 2$, and more typically n=2-50. Suitable poly(alkylene oxide) monomers include, but are not limited to, poly(propylene oxide) monomers, poly(ethylene oxide) monomers, poly(ethylene oxide/propylene oxide) monomers, poly(butylene oxide) monomers and combinations thereof. The poly(ethylene oxide/propylene oxide) monomers may contain blocks of ethylene oxide groups and blocks of propylene oxide groups or the ethylene oxide and propylene oxide groups may be randomly distributed. Such monomers typically have a degree of polymerization of from 1 to 50, and more typically from 2 to 50. In another embodiment, the poly(alkylene oxide) monomers may be reacted with another monomer, such as (meth)acrylic acid or an alkyl (meth)acrylate, to form a combined monomer. Such combined monomers include without limitation, poly(propylene glycol)(meth)acrylates, poly(propylene glycol)alkyl ether (meth)acrylates, poly(propylene glycol)phenyl ether (meth) acrylates, poly(propylene glycol) 4-nonylphenol ether (meth) acrylates, poly(ethylene glycol)(meth)acrylates, poly(ethylene glycol)alkyl ether (meth)acrylates, poly(ethylene glycol) phenyl ether (meth)acrylates, poly(propylene/ethylene glycol)alkyl ether (meth)acrylates and mixtures thereof. Exemplary combined monomers include trimethoylolpropane ethoxylate tri(meth)acrylate, trimethoylolpropane propoxylate tri(meth)acrylate, and poly(propylene glycol)methyl ether acrylate. These combined monomers are particularly useful as cross-linking agents in the present invention.

In a further embodiment, the present polymers may contain as polymerized units one or more silicon-containing monomers. Suitable silicon-containing monomers include, but are not limited to, vinyltrimethylsilane, vinyltriethylsilane, vinyltrimethoxysilane, vinyltriethoxysilane, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis(trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane, γ-propyl tri($C_1$-$C_6$)alkoxysilyl(meth)acrylate such as γ-trimethoxysilylpropyl(meth)acrylate, γ-propyl tri($C_1$-$C_6$)alkylsilyl(meth)acrylate, γ-propyl di($C_1$-$C_6$)alkoxy($C_1$-$C_6$)alkylsilyl(meth)acrylate, γ-propyl di($C_1$-$C_6$)alkyl($C_1$-$C_6$) alkoxysilyl(meth)acrylate, vinyl tri($C_1$-$C_6$)alkoxysilyl(meth) acrylate, vinyl di($C_1$-$C_6$)alkoxy($C_1$-$C_6$)alkylsilyl(meth) acrylate, vinyl($C_1$-$C_6$)alkoxydi($C_1$-$C_6$)alkylsilyl(meth) acrylate, vinyl tri($C_1$-$C_6$)alkylsilyl(meth)acrylate, 2-propylsilsesquioxane (meth)acrylate and mixtures thereof.

The polymers of the present invention are cross-linked. Any amount of cross-linker is suitable for use in the present invention. Typically, the present polymers contain at least 1% by weight of cross-linker, based on the weight of the polymer. Up to and including 100% cross-linking agent, based on the weight of the polymer, may be effectively used in the polymers of the present invention. It is preferred that the amount of cross-linker is from 5% to 100%, and more preferably from 10% to 90%. Other suitable amounts of cross-linker are from 5 to 75%, from 10 to 75%, and from 10 to 50%. In one embodiment, the cross-linked polymer may include only cross-linking monomers as the polymerized units, or may include one or more other monomers. For example, a cross-linked polymer including trimethylolpropane triacrylate and trimethylolpropane trimethacrylate is particularly useful.

A wide variety of cross-linking agents may be used in the present invention. Suitable cross-linkers include, but are not limited to, di-, tri-, tetra-, or higher multi-functional ethylenically or acetylenically unsaturated monomers, and more preferably multifunctional (meth)acrylate monomers. Exemplary cross-linkers include, without limitation, trivinylbenzene, divinyltoluene, divinylpyridine, divinylnaphthalene, divinylxylene, ethyleneglycol diacrylate, trimethylolpropane triacrylate, diethyleneglycol divinyl ether, trivinylcyclohexane, allyl methacrylate, ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate, divinyl benzene ("DVB"), glycidyl methacrylate, 1,3-butylene glycol diacrylate, 1,3-butylene glycol dimethacrylate, 1,4-butanediol diacrylate, diethylene glycol diacrylate, 1,6-hexanediol diacrylate, 1,6-hexanediol dimethacrylate, tripropylene glycol diacrylate, triethylene glycol dimethacrylate, tetraethylene glycol diacrylate, tetraethylene glycol dimethacrylate, polyethylene glycol dimethacrylate, ethoxylated bisphenol. A diacrylate, ethoxylated bisphenol. A dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, 1,4-benzenediol diacrylate, 1,4-benzenediol dimethacrylate, bis-(acryloxyethyl)phosphate, bisphenol-A diacrylate, bisphenol-A dimethacrylate, 1,4-butanediol diacrylate, 1,4-butanediol dimethacrylate, 2-butene-1,4-diol diacrylate, 2-butene-1,4-diol dimethacrylate, butylene glycol dimethacrylate, 1,2,4-butanetriol trimethacrylate, crotyl acrylate, crotyl methacrylate, 1,4-cyclohexanediol diacrylate, 1,4-cyclohexanediol dimethacrylate, decamethylene glycol diacrylate, decamethylene glycol dimethacrylate, diallyl isocyanurate, diallyl itaconate, di-(3-acryloxyethyl)ether of bisphenol-A, di-(acryloxy-2-hydroxypropyl)ether of bisphenol-A, diallyl fumarate, diisoproprenylbenzene, di-(3-methacryloxyethyl)ether of bisphenol-A, di-(3-methacryloxy-2-hydroxypropyl) ether of bisphenol-A, di-(3-methacryloxy-2-hydroxypropyl)ether of tetrachlorobisphenol-A, di-(3-methacryloxy-2-hydroxypropyl)ether of tetrabromobisphenol-A, di-(3-methacryloxy-2-hydroxypropyl)ether of 1,4-butanediol, di-(3-methacryloxy-2-hydroxypropyl) ether of diphenolic acid, 2,2-dimethyl-1,3-propanediol diacrylate; 2,2-dimethyl-1,3-propanediol dimethacrylate, dipropylene glycol dimethacrylate, gycerol triacrylate, gycerol trimethacrylate, hexamethylene glycol diacrylate, hexamethylene glycol dimethacrylate, hydrogenated bisphenol-A dimethacrylate, melamine acrylate, N,N'-methylenebisacrylamide, 1,9-nonanediol dimethacrylate, 1,5-pentanediol diacrylate, 1,5-pentanediol dimethacrylate, pentaerythritol trimethacrylate, 1-phenyl-1,2-ethanediol dimethacrylate, polyoxyethyl-2,2-di(p-hydroxyphenyl)propane diacrylate, polyoxyethyl-2,2-di(p-hydroxyphenyl)propane dimethacrylate, polyoxypropyltrimethylolpropane triacrylate, 1,3-propanediol diacrylate, 1,3-propanediol dimethacrylate, propoxylated bisphenol-A dimethacrylate, 1,3,5-triacryloylhexahydro-s-trazine, triethylene glycol diacrylate, 1,3,5-isopropenylbenzene, trimethylolethane triacrylate, trimethylolpropane diallyl ether mono-methacrylate, 2,2,4-trimethyl-1,3-pentanediol dimethacrylate, tris-(2-acryloxyethyl)isocyanurate, tris-(2-methacryloxyethyl)isocyanurate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly(phenyl vinyl siloxane) and mixtures thereof. Other suitable cross-linking agents are well-known to those skilled in the art and may also be used in the present invention.

The polymers useful in the present invention are generally commercially available, such as from the Rohm and Haas Company Philadelphia Pa. or may be prepared by any known means such as emulsion, solution or suspension polymerization. For example, U.S. Pat. No. 6,420,441 B1 (Allen et al.) discloses the preparation of certain cross-linked polymer particles using both emulsion and solution polymerization techniques.

The polymers useful as the sacrificial material in the present invention typically have a weight average molecular weight in the range of approximately 1000 to 10,000,000, more typically 10,000 to 5,000,000, and still more typically 10,000 to 1,000,000. When cross-linked polymer particles are used, such polymer particles typically have a mean particle size up to 1,000 nm, such as in the range of 1 to 1000 nm. Other suitable particle size ranges are from 1 to 200 nm, from 1 to 50 nm, and from 1 to 20 nm. It will be appreciated by those skilled in the art that a wide variety of particle sizes may be employed. The particle size polydispersity of these polymer particles is from 1.0001 to 10, more typically from 1.001 to 5, and even more typically from 1.01 to 3. In one embodiment, the sacrificial material layer includes as polymerized units one or more methacrylate monomers. Such methacrylate monomers may be present in the sacrificial material as a mono-functional monomer, a cross-linking agent or both.

The sacrificial material is disposed on a substrate to form a sacrificial material layer. Such layer may be formed by disposing a composition containing a cross-linked polymer on the substrate. Alternatively, such sacrificial material layer may be formed by disposing a composition containing one or more cross-linking agents on the substrate, followed by curing the one or more cross-linking agents to form a cross-linked polymer on the substrate. Optionally, such composition containing one or more cross-linking agents may also contain one or more monomers, one or more uncross-linked polymers, one or more cross-linked polymers, or a mixture of any of the foregoing. Thus, the present invention also provides a method of manufacturing a device including the steps of; a) disposing a composition including a sacrificial material composition on an electronic or optoelectronic device substrate; b) curing the sacrificial material composition to form a sacrificial material layer; c) disposing an overlayer material on the sacrificial material layer; and then d) removing the sacrificial material layer to form an air gap. It is preferred that the sacrificial material layer is disposed on the substrate by depositing a film of cross-linked polymer particles, by depositing a composition containing one or more cross-linking agents followed by curing, by depositing a composition containing cross-linked polymer particles and one or more cross-linking agents followed by curing, or by depositing a composition containing an uncross-linked polymer and one or more cross-linking agents followed by curing.

The sacrificial material layer may be disposed on the substrate as a melt, as a dry film, by chemical vapor deposition, or as a composition in a solvent. A wide variety of solvents may be used. The choice of solvent will depend on the particular application and the composition of the polymer. Suitable solvents include, but are not limited to; ketones such as methyl isobutyl ketone, methyl isoamyl ketone, diisobutyl ketone, cyclohexanone, and 2-heptanone; lactones such as γ-butyrolactone and γ-caprolactone; esters such as ethyl lactate, propyleneglycol monomethyl ether acetate, n-amyl acetate, and n-butyl acetate; ethers such as propyleneglycol monomethyl ether, diphenyl ether, anisole; N-methyl-2-pyrolidone; N,N'-dimethylpropyleneurea; aromatic solvents such as mesitylene, toluene and xylenes; alcohols; hydrocarbons; acids or mixtures thereof. Any suitable means may be used to dispose the sacrificial material melt or composition on the substrate, such as spin coating, dipping, roller coating, curtain coating, and the like.

Optionally, the sacrificial material layer may be multi-functional, i.e. it may serve more than one function. For example, when the sacrificial material layer contains a dye and is not otherwise photoactive, such sacrificial material layer may also function as an organic antireflectant layer.

Additionally, the sacrificial material layer may contain one or more additives, such as flow aids, thickeners, and the like. Such additives are typically present in small amounts, such as ≦5% by weight and more typically ≦3%.

When a sacrificial material composition is cured on a substrate to form a sacrificial material layer, such curing may be by any method that increases the molecular weight of one or more components in the composition. Typically, such method is polymerization. Such polymerization may be by any method such as Diels-Alder, anionic, cationic and, preferably, free-radical polymerization. Polymerization may be initiated thermally, photochemically, or by a combination of the two. Any suitable polymerization catalyst may then be added to the sacrificial material composition, such as thermal acid generators, thermal base generators, photoacid generators, photobase generators, free-radical initiators, and the like. Mixtures of such catalysts may be employed. Suitable photoacid and photobase generators are well-known to those skilled in the art. In one embodiment, the sacrificial material compositions that are to be cured on a substrate contain one or more free-radical polymerization initiators.

Examples of suitable polymerization catalysts, include, but are not limited to, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz (a)anthracene-7,12-dione. Other polymerization initiators which are also useful are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators. Also useful with photoinitiators are sensitizers as disclosed in U.S. Pat. No. 4,162,162. Though, not a free-radical generator, triphenylphosphine may be included in the photoactive chemical system as a catalyst. Such free-radical generators are particularly suitable for use with negative-acting photo-imageable compositions.

Particularly suitable photoinitiators include; 3-phenyl-5-isoxazolone/benzanthrone; 2-t-butylanthraquinone; 2,2-dimethoxy-2-phenylacetophenone; 1-hydroxycyclohexyl phenyl ketone, and diethoxyacetophenone. Other suitable photoinitiators are disclosed in Nippon Kagaku Kaisha No. 1192-199 (1984) and include 2,4,6,-tris(trichloromethyl)-1,3,5-triazine with 3,3'-carbonyl bis(7-diethylaminocoumarin), 1-methyl-2-benzylmethylene-1,2-dihydronaphthol (1,2d) thiazole, or 9-phenylacridine; 2-mecaptobenzimidazole with 9-phenylacridine; and 3-phenyl-5-isoxazoline with 9-fluorenone or 1-methyl-2-benzylmethylene-1,2-dihydronaphtho (1,2d) thiazole.

Exemplary photoinitiators are ketones having morpholino and s-phenyl groups, such as those disclosed U.S. Pat. No. 4,582,862 (Berner et al.). A preferred photoactive component is 2-methyl-1-[4-(methylthio)phenyl]-2-morpholinopropan-1-one.

Mixtures of photoactive components may optionally be used. When two photoactive components are used, they may be used in any ratio, such as from 99:1 to 1:99. Typically, such photoactive components are present in an amount of from 0.05 to 10% wt based on the total weight of the composition, more typically from 0.1 to 5% wt, and still more typically from 0.1 to 2% wt.

The sacrificial material of the present invention must be removable from the substrate. A wide variety of conditions may be used to effect such removal, including, without limitation, exposure to heat, pressure, vacuum or radiation such as, but not limited to, actinic IR, microwave, UV, x-ray, gamma ray, alpha particles, neutron beam, and electron beam, dissolution, chemical etching, plasma etching and the like. It will be appreciated that more than one method of removing the sacrificial material may be used, such as a combination of heat and actinic radiation. The use of actinic radiation in combination with heat may reduce the temperature needed for removal of the sacrificial material. In one embodiment, the actinic radiation is UV light. An exemplary UV light source is a pulsed broadband UV light source such as those available from Xenon Corp. Woburn Mass.

An overlayer material is deposited over the sacrificial material layer. The overlayer material may be a layer of any material that has sufficient porosity to allow the sacrificial material layer to be removed through it. Such overlayer materials may be organic, inorganic or organic-inorganic materials. It is preferred that the overlayer material is a dielectric material layer, with low-k dielectric materials being more preferred. Exemplary overlayer materials include, without limitation; inorganic materials such as carbides, oxides, nitrides and oxyfluorides of silicon, boron, or aluminum; organic polysilica materials; silicones; silicates; silazanes; and organic materials such as benzocyclobutenes, poly(aryl esters), poly(ether ketones), polycarbonates, polyimides, fluorinated polyimides, polynorbornenes, poly(arylene ethers), polyaromatic hydrocarbons, such as polynaphthalene, polyquinoxalines, poly(perfluorinated hydrocarbons) such as poly(tetrafluoroethylene), and polybenzoxazoles. Suitable overlayer materials are commercially available under the tradenames. Zirkon HM2800, TEFLON, AVATREL, BCB, AEROGEL, XEROGEL, PARYLENE F, and PARYLENE N "Organic polysilica material" (or organo siloxane) refers to a compound including silicon, carbon, oxygen and hydrogen atoms. In one embodiment, suitable organic polysilica materials contain hydrolyzates or partial condensates of one or more silanes of formulae (I) or (II);

wherein R is hydrogen, $(C_1-C_8)$alkyl, $(C_7-C_{12})$arylalkyl, substituted $(C_7-C_{12})$arylalkyl, aryl, and substituted aryl; Y is any hydrolyzable group; a is an integer of 0 to 2; $R^1$, $R^2$, $R^4$ and $R^5$ are independently selected from hydrogen, $(C_1-C_6)$alkyl, $(C_7-C_{12})$arylalkyl, substituted $(C_7-C_{12})$arylalkyl, aryl, and substituted aryl; $R^3$ is selected from $(C_1-C_{10})$alkyl, —$(CH_2)_h$—, —$(CH_2)_{h1}$-$E_k$-$(CH_2)_{h2}$—, —$(CH_2)_h$—Z, arylene, substituted arylene, and arylene ether; E is selected from oxygen, $NR^6$ and Z; Z is selected from aryl and substituted aryl; $R^6$ is selected from hydrogen, $(C_1-C_6)$alkyl, aryl and substituted aryl; b and d are each an integer of 0 to 2; c is an integer of 0 to 6; and h, h1, h2 and k are independently an integer from 1 to 6; provided that at least one of R, $R^1$, $R^3$ and $R^5$ is not hydrogen. Generally, when a=0, a compound of formula (II) is present in the hydrolyzate or partial condensate where at least one of $R^1$, $R^3$ and $R^5$ is not hydrogen. Typically, the hydrolyzate or partial condensate contains at least one silane of either formula (I) or (II) having an organic group for R, $R^1$, $R^3$ or $R^5$. "Substituted arylalkyl", "substituted aryl" and "substituted arylene" refer to an arylalkyl, aryl or arylene group having one or more of its hydrogens replaced by another substituent group, such as cyano, hydroxy, mercapto, halo, $(C_1-C_6)$alkyl, $(C_1-C_6)$alkoxy, and the like.

It is preferred that R is $(C_1-C_4)$alkyl, benzyl, hydroxybenzyl, phenethyl or phenyl, and more preferably methyl, ethyl, iso-butyl, tert-butyl or phenyl. Suitable hydrolyzable groups for Y include, but are not limited to, halo, $(C_1-C_6)$alkoxy, acyloxy and the like, and preferably chloro and $(C_1-C_2)$ alkoxy. Suitable organosilanes of formula (I) include, but are not limited to, methyl trimethoxysilane, methyl triethoxysilane, phenyl trimethoxysilane, phenyl triethoxysilane, tolyl trimethoxysilane, tolyl triethoxysilane, propyl tripropoxysilane, iso-propyl triethoxysilane, iso-propyl tripropoxysilane, ethyl trimethoxysilane, ethyl triethoxysilane, iso-butyl triethoxysilane, iso-butyl trimethoxysilane, tert-butyl triethoxysilane, tert-butyl trimethoxysilane, cyclohexyl trimethoxysilane, cyclohexyl triethoxysilane, benzyl trimethoxysilane, benzyl triethoxysilane, phenethyl trimethoxysilane, hydroxybenzyl trimethoxysilane, hydroxyphenylethyl trimethoxysilane and hydroxyphenylethyl triethoxysilane.

Organosilanes of formula (II) preferably include those wherein $R^1$ and $R^5$ are independently $(C_1-C_4)$alkyl, benzyl, hydroxybenzyl, phenethyl or phenyl. Preferably $R_1$ and $R^5$ are methyl, ethyl, tert-butyl, iso-butyl and phenyl. Preferably $R^3$ is $(C_1-C_{10})$alkyl, —$(CH_2)_h$—, arylene, arylene ether and —$(CH_2)_{h1}$-E-$(CH_2)_{h2}$. Suitable compounds of formula (II) include, but are not limited to, those wherein $R^3$ is methylene, ethylene, propylene, butylene, hexylene, norbornylene, cycloheylene, phenylene, phenylene ether, naphthylene and —$CH_2$—$C_6H_4$—$CH_2$—. It is further preferred that c is 1 to 4.

Suitable organosilanes of formula (II) include, but are not limited to, bis(hexamethoxysilyl)methane, bis(hexaethoxysilyl)methane, bis(hexaphenoxysilyl)methane, bis(dimethoxymethylsilyl)methane, bis(diethoxymethyl-silyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bis(dimethoxymethylsilyl)ethane, bis(diethoxymethylsilyl)ethane, bis(dimethoxyphenylsilyl)ethane, bis(diethoxyphenyl-silyl)ethane, bis(methoxydimethylsilyl)ethane, bis(ethoxydimethylsilyl)ethane, bis(methoxy-diphenylsilyl)ethane, bis(ethoxydiphenylsilyl)ethane, 1,3-bis(hexamethoxysilyl))propane, 1,3-bis(hexaethoxysilyl)propane, 1,3-bis(hexaphenoxysilyl)propane, 1,3-bis(dimethoxy-methylsilyl)propane, 1,3-bis(diethoxymethylsilyl)propane, 1,3-bis(dimethoxyphenyl-silyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, 1,3-bis(ethoxydiphenylsilyl)propane, and the like.

When the organic polysilica materials include a hydrolyzate or partial condensate of organosilanes of formula (II), c may be 0, provided that at least one of $R^1$ and $R^5$ are not hydrogen. In an alternate embodiment, the organic polysilica materials may include a cohydrolyzate or partial cocondensate of organosilanes of both formulae (I) and (II). In such cohydrolyzates or partial cocondensates, c in formula (II) can be 0, provided that at least one of R, $R^1$ and $R^5$ is not hydrogen.

In one embodiment, suitable organic polysilica materials are hydrolyzates or partial condensates of compounds of formula (I). Such organic polysilica materials have the formula (III):

$$((R^7R^8SiO)_e(R^9SiO_{1.5})_f(R^{10}SiO_{1.5})_g(SiO_2)_r)_n \quad (III)$$

wherein $R^7$, $R^8$, $R^9$ and $R^{10}$ are independently selected from hydrogen, $(C_1-C_6)$alkyl, $(C_7-C_{12})$arylalkyl, substituted $(C_7-C_{12})$arylalkyl, aryl, and substituted aryl; e, g and r are independently a number from 0 to 1; f is a number from 0.2 to 1; n is integer from 3 to 10,000; provided that e+f+g+r=1; and provided that at least one of $R^7$, $R^8$ and $R^9$ is not hydrogen. In the above formula (III), e, f, g and r represent the mole ratios of each component. Such mole ratios can be varied between 0 and 1. In the above formula, n refers to the number of repeat units in the material.

Suitable organic polysilica materials include, but are not limited to, silsesquioxanes, partially condensed halosilanes or alkoxysilanes such as partially condensed by controlled hydrolysis tetraethoxysilane having number average molecular weight of 500 to 20,000, organically modified silicates having the composition $RSiO_3$, $O_3SiRSiO_3$, $R_2SiO_2$ and $O_2SiR_3SiO_2$ wherein R is an organic substituent, and partially condensed orthosilicates having Si(OR)$_4$ as the monomer unit. Silsesquioxanes are polymeric silicate materials of the type $RSiO_{1.5}$ where R is an organic substituent. Suitable silsesquioxanes are alkyl silsesquioxanes; aryl silsesquioxanes; alkyl/aryl silsesquioxane mixtures; and mixtures of alkyl silsesquioxanes. Silsesquioxane materials include homopolymers of silsesquioxanes, copolymers of silsesquioxanes or mixtures thereof. Such materials are generally commercially available or may be prepared by known methods.

In an alternate embodiment, the organic polysilica materials may contain a wide variety of other monomers in addition to the silicon-containing monomers described above. For example, the organic polysilica materials may further comprise cross-linking agents, and carbosilane moieties. Such cross-linking agents may be any of the cross-linking agents described elsewhere in this specification, or any other known cross-linkers for silicon-containing materials. It will be appreciated by those skilled in the art that a combination of cross-linkers may be used. Carbosilane moieties refer to moieties having a (Si—C)$_x$ structure, such as (Si-A)$_x$ structures wherein. A is a substituted or unsubstituted alkylene or arylene, such as $SiR_3CH_2$—, —$SiR_2CH_2$—, RSiCH2——, and ——SiCH2——, where R is usually hydrogen but may be any organic or inorganic radical. Suitable inorganic radicals include organo-silicon, siloxyl, or silanyl moieties. These carbosilane moieties are typically connected "head-to-tail", i.e. having. Si—C—Si bonds, in such a manner that a complex, branched structure results. Particularly useful carbosilane moieties are those having the repeat units ($SiH_xCH_2$) and ($SiH_{y-1}$ ($CH=CH_2$)$CH_2$), where x=0 to 3 and y=1 to 3. These repeat units may be present in the organic polysilica resins in any number from 1 to 100,000, and preferably from 1 to 10,000. Suitable carbosilane precursors are those disclosed in U.S. Pat. No. 5,153,295 (Whitmarsh et al.) and U.S. Pat. No. 6,395,649 (Wu).

In a further embodiment, an organic polysilica overlayer material may be applied using a spin-on carbosilane moiety or carbosilane precursor. If a carbosilane precursor is used, a layer of such precursor is applied and then such precursor is converted to a carbosilane, such as by the use of heat, light or a combination thereof.

Other suitable organic polysilica materials are co-hydrolyzates or partial condensates of one or more organosilanes of formulae (I) and/or (II) and one or more tetrafunctional silanes having the formula. $SiY_4$, where Y is any hydrolyzable group as defined above. Suitable tetrafunctional silanes of the formula. $SiY_4$ include, but are not limited to, tetramethoxysilane, tetraethoxysilane, tetrachlorosilane, and the like. The ratio of such organosilanes to tetrafunctional silanes is typically from 99:1 to 1:99, preferably from 95:5 to 5:95, more preferably from 90:10 to 10:90, and still more preferably from 80:20 to 20:80.

When an organic material is used as the overcoat layer, it should be selected such that it is stable under the conditions used to remove the sacrificial material. In one embodiment, the overlayer materials are composed of inorganic materials, such as organic polysilica materials and particularly comprise a silsesquioxane. Particularly useful silsesquioxanes are methyl silsesquioxane, ethyl silsesquioxane, propyl silsesquioxane, iso-butyl silsesquioxane, tert-butyl silsesquioxane, phenyl silsesquioxane, tolyl silsesquioxane, benzyl silsesquioxane or mixtures thereof. Methyl silsesquioxane, phenyl silsesquioxane and mixtures thereof are particularly suitable. Other useful silsesquioxane mixtures include mixtures of hydrido silsesquioxanes with alkyl, aryl or alkyl/aryl silsesquioxanes.

As described above, the overlayer material should have sufficient porosity to allow the sacrificial material to be removed through it. Such porosity may be inherent in the material used, such as in the case of silica-based xerogels or aerogels, or may be imparted by other means. Suitable means for imparting porosity include the use of "porogens" or pore forming materials. Exemplary porogens include, but are not limited to, removable solvents, removable monomers or polymers and the like. See, e.g., U.S. Pat. Nos. 5,700,844, 5,776, 990, 5,895,265 (Carter et al.), U.S. Pat. No. 6,271,273 (You et al.), U.S. Pat. No. 6,391,932 (Gore et al.), and U.S. Pat. No. 6,420,441 B1 (Allen et al.) for methods of making porous dielectric materials using porogens. When porogens are used to prepare the porous overlayer materials, they are typically used in an amount of from 1 to 50% wt. Other suitable amounts of porogens are from 1 to 20% wt, from 1 to 10% wt and from 1 to 5% wt. In general, the level of porosity in a porous layer is approximately equivalent to the amount of porogen used to form the porous layer. Thus, an overlayer containing 5% wt of porogen will provide an overlayer having approximately 5% porosity after removal of the porogens. Typical conditions for the removal of the porogens from the overlayer include those described above for the removal of the sacrificial material. In particular, the porogens may be removed by heat, actinic radiation or a combination of heat and actinic radiation. Particularly suitable actinic radiation is UV light.

Particularly suitable overlayer materials are porous organic polysilica materials. Typically, such porous organic polysilica overlayer materials are formed by the removal of polymers from the organic polysilica overlayer materials. When such a process is used, the porogens used to form the organic polysilica overlayer material are removed from the organic polysilica materials under the same conditions as those used to remove the sacrificial material or alternatively under conditions which do not remove the sacrificial material. In one embodiment, any porogen may be removed from the organic polysilica overlayer material to form a porous overlayer material concurrently with the removal of the sacrificial material. Alternatively, any porogen may be removed from the organic polysilica overlayer material to form a porous overlayer material and then the sacrificial material may be removed. In yet another embodiment, when an overlayer material has sufficient inherent porosity to allow removal of the sacrificial material and contains porogens, such porogens may be removed from the overlayer material prior to, concurrently with or after removal of the sacrificial material. In such case, the porogens need not be removed from the overlayer material at all.

The present sacrificial material may be used to form air gaps in devices made by a variety of methods, such as damascene or dual damascene processes, as well as by other device fabrication techniques. In general, the sacrificial material is disposed on a substrate by any of the above described means. A porous overlayer is then disposed on the sacrificial material. The overlayer material may be disposed on the sacrificial material by any suitable means, including, without limitation, spin coating, roller coating, curtain coating, chemical vapor deposition, lamination and the like. Such methods are well-known to those skilled in the art of depositing dielectric materials.

The sacrificial material is then removed by subjecting it to conditions which degrade, decompose or otherwise cause the sacrificial material to form volatile fragments or components which can then pass through the porous overlayer material. In one embodiment, the sacrificial material is removed by heating. Such heating may be in an oxygen containing atmosphere such as air or may be in an inert atmosphere such as nitrogen or argon. In general, the present sacrificial materials are removed upon heating at a temperature in the range of 150° to 450° C., or higher. More typically, the sacrificial material is removed upon heating at a temperature of 225° to 400° C. In another embodiment, the sacrificial material is removed by a combination of heat and actinic radiation such as UV light. An advantage of the present invention is that the particular removal temperature of the sacrificial material can be controlled by selection of the monomers used, the cross-linking agents used and by the amount of monomers and cross-linking agents used. Such selection is well within the ability of those skilled in the art. Typically, the present sacrificial material leaves very little residue behind, such as $\leq$10% wt, preferably $\leq$5% wt and more preferably $\leq$2% wt.

Figure 1A:
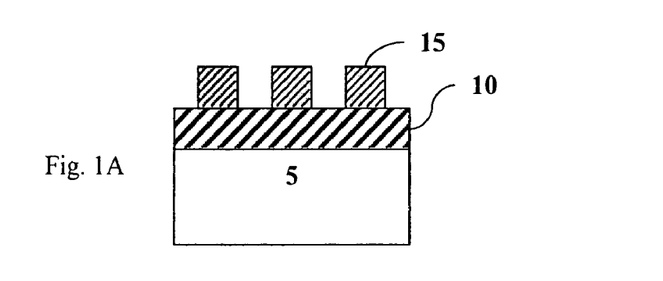
FIGS. 1A-1D illustrate one embodiment of air gap formation according to the invention, not to scale.
Figure 1B:
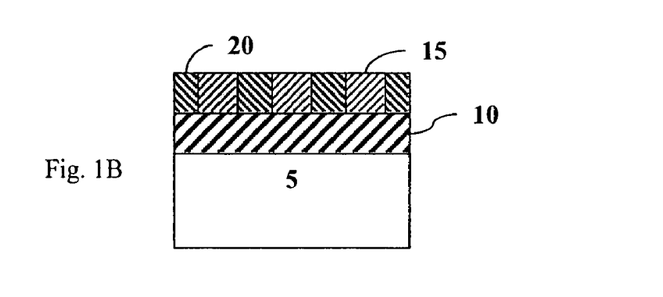
Figure 1C:
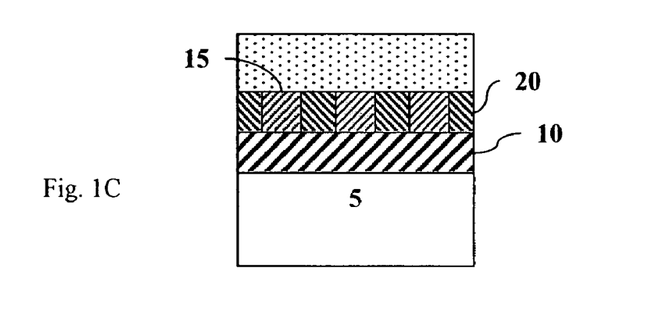
Figure 1D:
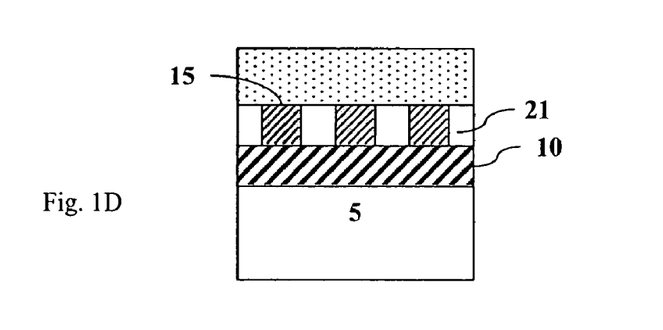

In another embodiment, the sacrificial material is disposed on a substrate that has patterned metal lines. FIGS. 1A to 1D illustrate a first embodiment of air gap formation in which metal lines are formed prior to disposing the sacrificial material on the substrate, not to scale. In FIG. 1A, a structure including substrate 5 having dielectric layer 10 disposed on the substrate 5 and metal lines 15 disposed on dielectric layer 10 is provided. A sacrificial material is then disposed on the structure of FIG. 1A to form the structure of FIG. 1B, where sacrificial material 20 is disposed on dielectric layer 10 and between metal lines 15. A porous overlayer 25 is then disposed on both sacrificial material 20 and metal lines 15, as shown in FIG. 1C. The structure of FIG. 1C is then subjected to conditions, such as heating, which degrade, decompose or otherwise cause sacrificial material 20 to form volatile fragments or components which are then removed through porous overlayer 25. This results in the formation of air gaps 21 where sacrificial material 20 had been present, as shown in FIG. 1D.

Figure 2A:
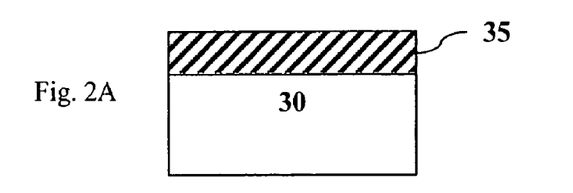
FIGS. 2A-2D illustrate an alternate embodiment of air gap formation according to the invention, not to scale.
Figure 2B:
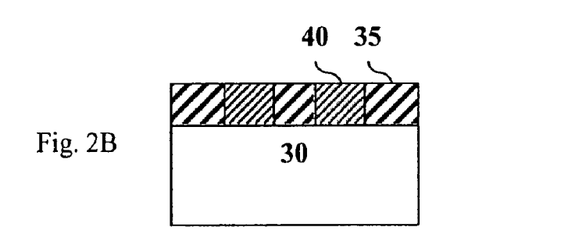
Figure 2C:
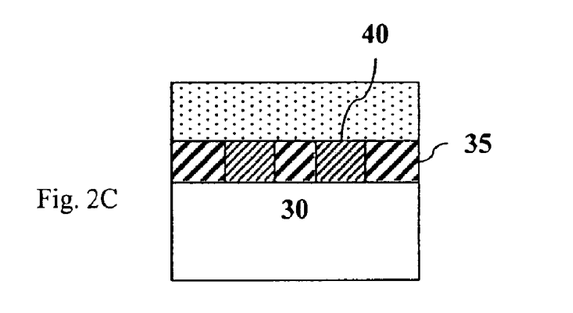
Figure 2D:
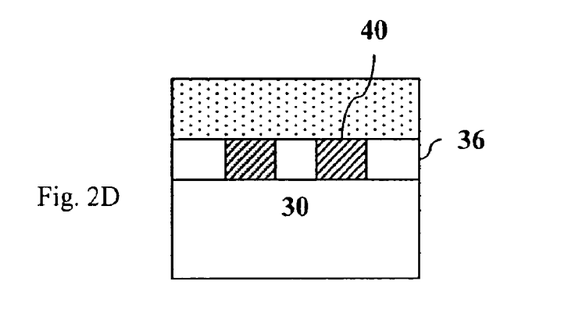

In another embodiment, the sacrificial material may be disposed on a substrate prior to the formation of metal lines in this particular level of the structure. FIGS. 2A to 2D illustrate air gap formation using a sacrificial material in a damascene process, not to scale. Sacrificial material 35 is first disposed on substrate 30, as shown in FIG. 2A. Sacrificial material 35 is then patterned. Such patterning may be accomplished by a variety of means such as by disposing a pbotoresist on the sacrificial material followed by imaging, developing and etching. Alternatively, the sacrificial material itself may be photoimageable. When a photoimageable sacrificial material is used, it may be imaged directly by exposing it to the appropriate wavelength of actinic radiation through a mask, followed by development. Such lithographic processes are well-known to those skilled in the art. Following patterning, metal lines 40 are formed in sacrificial material 35, as shown in FIG. 2B. Porous overlayer 45 is then disposed on both the sacrificial material 35 and metal lines 40, as shown in FIG. 2C. The structure of FIG. 2C is then subjected to conditions, such as heating, which degrade, decompose or otherwise cause sacrificial material 35 to form volatile fragments or components which are then removed through porous overlayer material 45. This results in the formation of air gaps 36 where sacrificial material 35 had been present, as shown in FIG. 2D.

Figure 3:
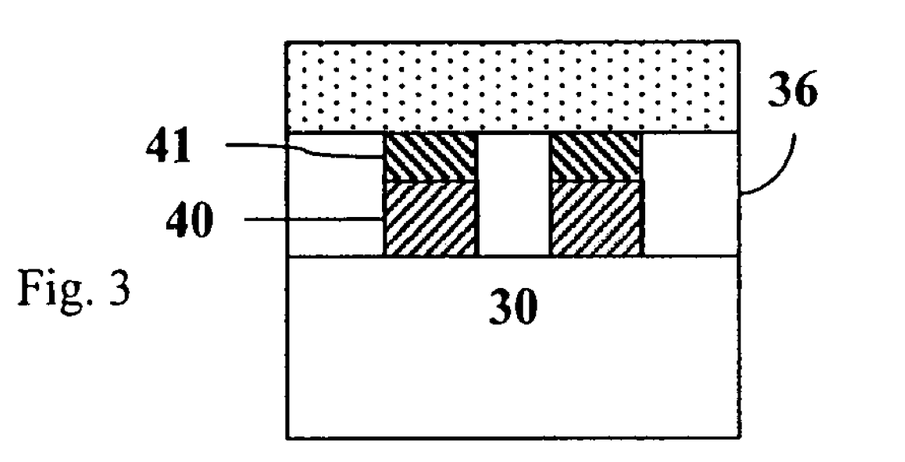
FIG. 3 illustrates an alternate structure having an air gap produced according to the invention, not to scale.

In an alternate embodiment of a damascene processes, a barrier layer may be deposited on copper lines prior to the porous overlayer material being disposed on both the sacrificial material and the copper lines. Such a structure resulting from this optional step is shown in FIG. 3, where copper lines 40 are disposed on substrate 30, copper migration barrier layer 41 is disposed on copper lines 40, porous overlayer material 45 is disposed on barrier layer 41, and air gaps 36 are formed after removal of the sacrificial material. Thus, the present invention provides an electronic device including copper lines formed on a substrate, the copper lines having one or more copper diffusion barriers disposed thereon, air gaps formed between at least a portion of the copper lines and the copper diffusion barriers, and a porous overlayer material disposed over the copper diffusion barriers and the air gaps.

Figure 4A:
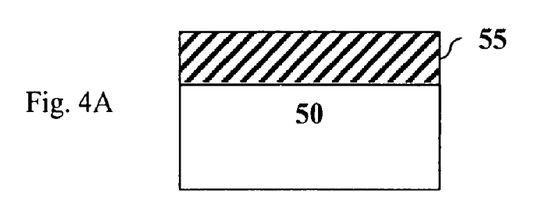
FIGS. 4A-4D illustrate a further embodiment of air gap formation according to the invention, not to scale.
Figure 4B:
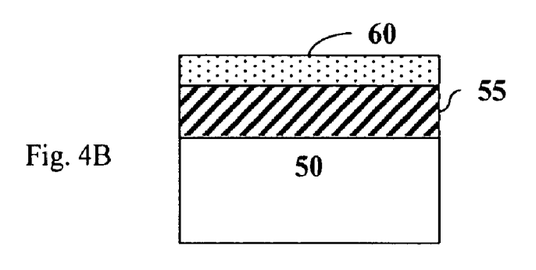
Figure 4C:
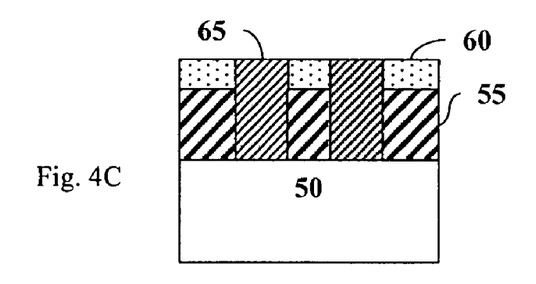
Figure 4D:
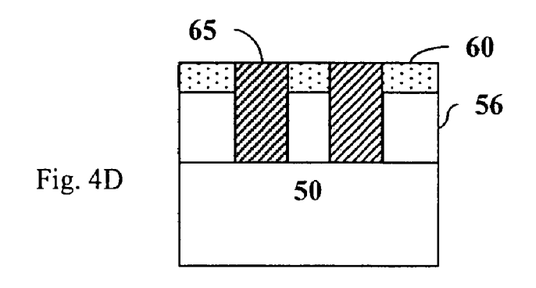

In yet another embodiment of a damascene process, a porous overlayer material is disposed on the sacrificial material prior to the formation of metal lines. In FIG. 4A, sacrificial material 55 is disposed on substrate 50. Porous overlayer material 60 is then disposed on sacrificial material 55, as shown in FIG. 4B. Both porous overlayer material 60 and sacrificial material 55 are patterned. This may be accomplished by disposing a photoresist on porous overlayer 60 followed by imaging, developing and etching. Alternatively, the porous overlayer, or both porous overlayer and the sacrificial, may be photoimageable. When a photoimageable porous overlayer is used, it may be imaged directly by exposing it to the appropriate wavelength of actinic radiation through a mask, followed by development and etching. Such lithographic processes are well-known to those skilled in the art. Following patterning, metal lines 65 are formed in sacrificial material 35 and porous overlayer 60, as shown in FIG. 4C, by vapor deposition, electroless metal plating, or electrolytic metal plating. The structure of FIG. 4C is then subjected to conditions, such as heating, which degrade, decompose or otherwise cause the sacrificial material 55 to form volatile fragments or components which are then removed through the porous overlayer material 60. This results in the formation of air gaps 56 where the sacrificial material 55 had been present, as shown in FIG. 4D. Accordingly, the present invention also provides an electronic device structure comprising metal lines and a sacrificial material disposed on a substrate, and an overlayer material disposed over the sacrificial material and adjacent to the metal lines. The present invention also provides an electronic device including metal lines disposed on a substrate, air gaps formed between at least a portion of the metal lines and an overlayer material, the overlayer material being disposed over the air gaps and adjacent to the metal lines. In one embodiment of such structure, the metal lines are copper lines. In another embodiment, a copper diffusion barrier is disposed on the copper ions. In yet another embodiment, the overlayer material functions as a copper diffusion barrier layer. In such structures, the overlayer material is not disposed on the metal lines.

It will be appreciated by those skilled in the art that the term "metal lines" refers to any metal deposit suitable for conducting an electrical signal, such as vias and trenches.

When the present sacrificial material is used in a damascene process, it may also be important to provide active sites for the deposition of a barrier layer to occur. Such sites should be uniformly distributed on the surface. While this is less critical for physical vapor deposition methods, it is critical for chemical vapor deposition ("CVD") and especially for atomic layer vapor deposition ("ALD"). In atomic layer deposition the barrier layer is deposited by first exposing the etched surface to a reactive gas in a vacuum chamber allowing the deposition of a single layer of metal atoms by reaction of the metal with functional groups on the polymer surface. A typical molecule used as a precursor for such deposition is titanium tetrachloride, although any other reactive metal species will due including. $TaCl_5$, $W(CO)_6$ and $TiBr_4$. In a subsequent step, excess metal precursor is removed from the chamber and then a different gas such as ammonia is introduced to the surface to react with the $TiCl_3$ and $TiCl_2$ that reside on the surface. The reaction results in the formation of Ti—N bonds and then the excess ammonia is removed and the process repeated until a sufficiently thick barrier is created to prevent copper diffusion. Other amines can be also used, such as methylamine. Carbon precursors can also be used in combination with the amines or alone to create titanium carbonitride or a titanium carbide layer instead of the titanium nitride layer formed by the reaction with ammonia. Similar combinations can be produced by use of the tungsten, tantalum, or other metal precursors that are known in the art for formation of barrier layers.

One method of creating sufficient surface functionality in the sacrificial material is to incorporate reactive functional groups into the sacrificial material, such as carboxyl, amine, imine, oxime, hydroxy, aldehyde, disulfide, or thiol groups or any combination thereof, that allow the reactive metal species to react uniformly with the sacrificial material after etch and thereby minimize the thickness required for the barrier layer. An alternate embodiment to creating a uniform barrier uses a sacrificial polymer including a silicon-containing monomer or other oxide or ceramic or other metal-containing monomer such as those containing titanium or aluminum as polymerized units that after etch provides a sufficient number of surface silanol groups to provide good surface coverage for the reactive metal species. Such alternate method is preferred as the silicon-oxygen-metal bonds are extremely stable and will provide good adhesion of the barrier layer to the sacrificial material. Yet another method of creating surface functional groups is to expose the sacrificial material to a reactive solution or plasma that converts existing functional groups to those that will react with a CVD or ALD metal precursor. In one embodiment a sacrificial material composed of (meth) acrylate moieties that are unreactive toward titanium tetrachloride is exposed to an oxygen-containing plasma to convert surface functional groups to moieties such as hydroxyl and/or carboxyl groups. These groups are now more reactive toward the titanium precursor than the non-plasma treated groups.

The cross-linked polymeric sacrificial material of the present invention provides numerous advantages over conventional sacrificial materials in forming air gaps. Such cross-linked polymers can be tailored to provide materials that can be removed at desired temperatures ranges, can be removed at lower temperatures compared to conventional materials, leaves a lower amount of residue than conventional materials, can be made photoimageable, can create uniform sidewalls for smooth metal lines, and can be a means for depositing other barrier materials.

In a still further embodiment, the present sacrificial material is useful in the manufacture of MEMS and NEMS. One important aspect of such devices is the partial or complete physical separation of some of the patterned features from the device substrate. Such separation allows for the mechanical movement in such electromechanical devices.

The present invention provides a method of manufacturing electromechanical devices including the steps of disposing a sacrificial material layer on a device substrate, disposing a top material layer on the sacrificial material layer, optionally curing the top material layer to provide desired mechanical properties, patterning the sacrificial material layer to form a desired electromechanical feature, and removing the sacrificial material layer. The sacrificial material layer may be disposed on the substrate by any of the methods described above. The sacrificial material is typically baked to remove any solvent prior to the addition of the top material layer. Optionally, the sacrificial material layer may be cured prior to the addition of the top material layer. In general, the sacrificial material layer is cured before such material is patterned. The sacrificial material may be patterned by any of the method described above. The top material layer is typically disposed on the sacrificial material layer by vapor deposition techniques or by spin-on techniques, but other suitable techniques may be used. The top material layer includes, but is not limited to, silicon carbide, silicon nitride, silica, aluminum, titanium nitride, titania, high resistivity materials, metals, alloys and the like. Particularly useful metals include tungsten, tantalum, titanium, copper, silver, gold, and platinum. Particularly useful alloys are those containing one or more of the aforementioned metals. A wide variety of other materials may be used as the top material layer, provided that they can be applied and processed without causing degredation of the sacrificial material layer. When the top material layer is a pre-ceramic material layer, it is typically cured, such as by heating or other suitable means, to provide the desired properties in the top material layer. Suitable desired mechanical properties include, but are not limited to, tensile strength, hardness, elasticity, abrasion resistance, and fracture toughness. The temperatures of any heating step used to cure the top material layer is typically selected such that it is below the degradation or removal temperature of the sacrificial material layer. After subsequent removal of the sacrificial material film, the top material layer may be further cured to maximize the desired mechanical properties set by the initial curing step.

Also provided by the present invention is a method of manufacturing electromechanical devices including the steps of disposing a sacrificial material layer on a device substrate, patterning the sacrificial material layer, disposing a top material layer on the sacrificial material layer, optionally curing the top material layer to provide desired mechanical properties, and removing the sacrificial material layer.

The removal of the sacrificial material layer releases the feature on the device for physical movement. The sacrificial material layer may be removed by any of the methods described above, e.g. heat, light, dry development using plasma, wet development using chemicals such as a base or other stripping agent, and the like. Suitable electromechanical features include, without limitations, gears, actuators, vibrating arms, sliding blocks, deformable plates, levers and the like. The present invention is useful in forming voids in SoC devices such as for chromatographic techniques.

The following examples are expected to illustrate further various aspects of the present invention, but are not intended to limit the scope of the invention in any aspect.

EXAMPLES 1-28

Cross-linked polymer particles are prepared using the solution polymerization techniques disclosed in U.S. Pat. No. 6,420,441 B1 (Allen et al.). The compositions of the cross-linked polymers are shown in Table 1.

TABLE 1

| Example | Cross-linked Polymer Particle Composition (wt/wt) |
| --- | --- |
| 1 | MMA/TMPTMA (50/50) |
| 2 | TMPTMA (100) |
| 3 | Styrene/TMPTMA (70/30) |
| 4 | HEMA/TMPTMA (70/30) |
| 5 | HEMA/ALMA (70/30) |
| 6 | 4-Vinyl toluene/TMPTMA (70/30) |
| 7 | HPMA/TMPTMA (70/30) |
| 8 | 3-(Trimethoxysilyl) propyl methacrylate/TMPTMA (70/30) |
| 9 | Styrene/PETMA (65/35) |
| 10 | HEMA/PETMA (75/25) |
| 11 | HPMA/ethoxypropyl trimethacrylate (75/25) |
| 12 | Styrene/HEMA/ethoxypropyl trimethacrylate (45/25/30) |
| 13 | MMA/trimethyleneglycol dimethacrylate (70/30) |
| 14 | MMA/PETA (75/25) |
| 15 | MMA/Styrene/trimethyleneglycol dimethacrylate (30/40/30) |
| 16 | HPMA/diethyleneglycol dimethacrylate (65/35) |
| 17 | HEMA/diethyleneglycol dimethacrylate (60/40) |
| 18 | Styrene/HPMA/EGDMA (40/20/40) |
| 19 | Styrene/ethoxypropyl trimethacrylate (60/40) |
| 20 | 3-(trimethoxysilyl)propyl methacrylate/Styrene/TMPTA (15/50/35) |
| 21 | t-butyl methacrylate/Styrene/TMPTMA (5/62/33) |
| 22 | t-butyl acrylate/HPMA/TMPTMA (8/62/30) |
| 23 | Hydroxystyrene/MMA/ALMA (40/25/35) |
| 24 | 4-Vinyl toluene/MMA/diethyleneglycol diacrylate (40/15/45) |
| 25 | HEMA/diethyleneglycol dimethacrylate (60/40) |
| 26 | α-Methyl styrene/3-(Trimethoxysilyl) propyl methacrylate/TMPTMA (35/35/30) |
| 27 | DVB/HEMA/MMA/n-butyl methacrylate (30/60/9/1) |
| 28 | Hydroxypolypropylene glycol methacrylate/1,3-propanediol dimethacrylate (90/10) |
| 29 | Hydroxypolypropylene glycol methacrylate/TMPTMA (90/10) |

EXAMPLE 30

Compositions are prepared containing cross-linked polymers of any one of Examples 1-29 in a suitable solvent for spin coating, such as propylene glycol monomethyl ether acetate. These compositions are then spin coated on a series of wafers to form a sacrificial material film. The wafer is then soft-baked at 150° C. for 1 minute to remove the solvent. An organic polysilica material containing methylsilsesquioxane and phenylsilsesquioxane and a cross-linked polymer particle as a removable porogen is then disposed on the surface of the sacrificial material as an overlayer material. The organic polysilica is soft-baked at 90° C. for 10 minutes, followed by baking at 130° C. to cure the organic polysilica material. A commercial photoresist is next applied to the organic polysilica. The photoresist is then baked, imaged, and developed. The organic polysilica material and the sacrificial material are then etched to form a pattern and the photoresist is then removed, tantalum/tantalum nitride barrier and copper seed layers are formed using conventional vapor deposition processes. Copper lines are then formed in the pattern using. Ultrafill 2001 copper electroplating bath, available from Shipley Company Marlborough Mass. and standard plating conditions. Following plating, the wafer is next planarized using chemical mechanical planarization using a commercial slurry and a model IC 1010 pad, both available from Rodel Inc. Newark, Del. Following planarization, the removable porogen in the organic polysilica material is removed by heating the wafer at 250° for 1 hour to form a porous organic polysilica overlayer material. Next, the wafer is heated at 400-450° C. for 1 hour to remove the sacrificial material to form air gaps.

EXAMPLE 31

The procedure of Example 30 is repeated except that the order of steps is changed. After the sacrificial material is disposed on the wafer and dried, it is patterned using conventional lithographic techniques, followed by etching and barrier layer deposition. Copper is next deposited into the etched features on the wafer and the wafer is then planarized. Following planarization, an organic polysilica material containing methylsilsesquioxane and phenylsilsesquioxane and a cross-linked polymer particle as a removable porogen is then disposed on the surfaces of the sacrificial material and the copper lines as an overlayer material. The organic polysilica is soft-baked at 90° C. for 10 minutes, followed by baking at 130° C. to cure the organic polysilica material. The removable porogen in the organic polysilica material is then removed by heating the wafer at 250° for 1 hour to form a porous organic polysilica overlayer material. Next, the wafer is heated at 400-450° C. for 1 hour to remove the sacrificial material to form air gaps.

EXAMPLE 32

A sacrificial material composition containing TMPTMA and a free-radical polymerization catalyst in propylene glycol monomethyl ether acetate is spin coated on a wafer. The wafer is then soft-baked to remove the solvent. The resulting sacrificial material layer is next blanket exposed to the appropriate wavelength of actinic radiation to cause polymerization of the TMPTMA to form a sacrificial material film. This film is then processed according to the procedures of either Example 30 or Example 31.

EXAMPLE 33

The procedure of Example 32 is repeated except that the sacrificial material composition contains TMPTMA, a free-radical polymerization catalyst, a polymer containing styrene and PETMA as polymerized units in a weight ratio of 70/30 and propylene glycol monomethyl ether acetate.

EXAMPLE 34

A photosensitive, thermally removable composition is prepared by combining the components and in the amounts listed in the table. The total solids content of the composition is ≧60%.

TABLE 2

| Component | Amount (% wt) |
| --- | --- |
| Copolymer of ethyl methacrylate, butyl acrylate and dimethylaminoethyl methacrylate in solvent | 80 |
| Dipentaerythritol monohydroxy pentaacrylate | 17 |
| 2-Methyl-1-[4-(methylthio)phenyl]-2-morpholinopropan-1-one | 2 |
| 2-Isopropylthioxanthone | 0.7 |
| Other additives | 0.3 |

This composition is spin coated on a semiconductor wafer as follows. The composition is dispensed onto the center of a static wafer and the wafer is spun for 1 minute at 2500 rpm to spread the composition across the wafer. Next, the edgebead is removed from both the topside and the backside of the wafer. The composition is then baked (1 min.) at 100° C. on a hot plate (off-contact) and then allowed to cool.

The coated wafer is next imaged at 365 nm through a mask. The imaged composition is next developed with lactic acid to provide a patterned photosensitive composition.

A tantalum/tantalum nitride barrier layer is next vapor deposited on the wafer. A copper is then vapor deposited on the barrier layer. The features are then filled with copper using a commercially available copper electroplating bath, such as Ultrafill 2001, available from Shipley Company. The wafer is next planarized using chemical mechanical polishing to remove the copper and barrier deposits on top of the sacrificial material. An electroless copper (CoWP) diffusion barrier is deposited solely on the copper to seal the copper layer. Next, a organic polysilica dielectric composition containing 10% wt of a porogen, such as Zirkon LK 2700 dielectric material available from the Shipley Company Marlborough Mass. is spin coated on the wafer. The organic polysilica dielectric composition is at least partially cured by heating to 250° C., followed by heating the wafer to a temperature sufficient to remove the porogen and then heating the wafer to 350-450° C. to remove the sacrificial material.

EXAMPLE 35

To a flask containing an organic solvent is added 70 g of the polymer particle composition of Example 7. Methacrylic anhydride is added to the flask in a mole ratio less than the level of hydroxyl groups in the polymer particle. The solution is stirred for 2 hours and then 10 g of an ion-exchange resin (IRA-400, available from Rohm and Haas Company) is added to the solution. The solution is then filtered to remove the ion-exchange resin. To this solution is then added 30 g of TMPTMA and a free radical initiator (IRGACURE 500 available from Ciba Geigy). The mixture is then coated onto an electronic device substrate and cured at 300-350° C. The resultant film is stable. An organic polysilica overlayer material is applied to the cured mixture. The device is then heated to 400° C. under nitrogen to remove the cured polymer mixture and to form an air gap.

EXAMPLE 36

A solution is prepared by combining 40.3 g styrene/2-hydroxyethyl methacrylate/methyl methacrylate/n-butyl methacrylate in Dowanol PM (27% solids), 45 g of a solution of glycouril crosslinker (Powderlink 1174) in ethyl lactate (10% solids), 0.15 g of p-toluenesulfonic acid, and 16.5 g of Dowanol PM acetate. The resulting weight ratio for the solid components is 69% polymer, 30% crosslinker, and 1% acid catalyst, and a total solids content of 15%. The material is then filtered (0.05 μm filter) and coated on a 200 mm silicon wafer at 2500 rpm, then softbaked at 150° C., resulting in a film approximately 600 nm in thickness. The material is decomposed at 450° C. for 60 min. under nitrogen, and the resulting difference in film thickness is measured (see Table 3, below).

EXAMPLE 37

A solution is prepared by combining 47.6 g hydroxypolypropylene glycol methacrylate/trimethylol propyl trimethacrylate (90/10) in Dowanol PM acetate (14.5% solids), 30 g of a solution of glycouril crosslinker (Powderlink 1174) in ethyl lactate (10% solids), 0.1 g of p-toluenesulfonic acid, and 22.3 g of Dowanol PM acetate. The resulting weight ratio for the solid components is 69% polymer, 30% crosslinker, and 1% acid catalyst, and a total solids content of 10%. The material is then filtered (0.05 μm filter) and coated on a 200 mm silicon wafer at 2500 rpm, then softbaked at 150° C., resulting in a film approximately 80 nm in thickness. The material is decomposed at 450° C. for 60 min. under nitrogen, and the resulting difference in film thickness is measured (see Table 3, below).

TABLE 3

|  | Film Thickness (Å) after 150° C. Bake | Film Thickness (Å) after 450° C. Bake | % FTL |
|---|---|---|---|
| Example 36 | 5944 | 408 | 93.1% |
| Example 37 | 809 | 139 | 82.8% |

In Table 3, the term "FTL" refers to film thickness loss after baking at 450° C. These data clearly show that >80% of the film thickness is lost after baking.

What is claimed is;

1. An electronic device comprising a first layer comprising metal lines and a sacrificial material layer disposed between the metal lines, and a second layer disposed over the metal lines and the sacrificial material; wherein the sacrificial material layer comprises a cross-linked polymer containing as polymerized units one or more monomers chosen from (meth)acrylic acid, (meth)acrylamides, alkyl (meth)acrylates, alkenyl(meth)acrylates, aromatic (meth)acrylates, vinyl aromatic monomers, nitrogen-containing compounds and their thio-analogs, substituted ethylene monomers, cyclic olefins, and substituted cyclic olefins.

2. An electronic device comprising metal lines and a sacrificial material disposed between the metal lines, and an overlayer material disposed over the sacrificial material and adjacent to the metal lines, wherein the sacrificial material layer comprises a cross-linked polymer containing as polymerized units one or more monomers chosen from (meth)acrylic acid, (meth)acrylamides, alkyl (meth)acrylates, alkenyl (meth)acrylates, aromatic (meth)acrylates, vinyl aromatic monomers, nitrogen-containing compounds and their thio-analogs, substituted ethylene monomers, cyclic olefins, and substituted cyclic olefins.

3. The device of claim 2 wherein the overlayer material is porous.

4. An electronic device comprising copper lines formed on a substrate, the copper lines having one or more copper diffusion barriers disposed thereon, air gaps formed between at least a portion of the copper lines and the copper diffusion barriers, and a porous overlayer material disposed over the copper diffusion barrier and the air gaps, wherein the copper diffusion barrier comprises metal atoms.

* * * * *